(12) United States Patent
Chou et al.

(10) Patent No.: US 9,272,315 B2
(45) Date of Patent: Mar. 1, 2016

(54) MECHANISMS FOR CONTROLLING GAS FLOW IN ENCLOSURE

(71) Applicant: Taiwan Semiconductor Manufacturing Co., Ltd, Hsin-Chu (TW)

(72) Inventors: You-Hua Chou, Hsinchu (TW); Kuo-Sheng Chuang, Hsinchu (TW); Yii-Cheng Lin, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 63 days.

(21) Appl. No.: 14/051,532

(22) Filed: Oct. 11, 2013

(65) Prior Publication Data

US 2015/0101482 A1 Apr. 16, 2015

(51) Int. Cl.
| | | |
|---|---|---|
| *B08B 17/00* | (2006.01) | |
| *B01D 46/44* | (2006.01) | |
| *F24F 3/16* | (2006.01) | |
| *H01L 21/67* | (2006.01) | |

(52) U.S. Cl.
CPC .............. *B08B 17/00* (2013.01); *B01D 46/442* (2013.01); *B01D 46/446* (2013.01); *B01D 2258/0216* (2013.01); *B01D 2279/51* (2013.01); *F24F 3/1607* (2013.01); *H01L 21/67017* (2013.01)

(58) Field of Classification Search
CPC ........ B01D 46/00; B01D 50/00; B01D 53/02; B01D 53/26; B01D 53/265; B01L 1/04; F24F 7/06; F24F 3/16; H01L 21/00; H01L 21/67017

USPC .............. 55/385, 2, 338, 340, 467, 482, 318, 55/473, DIG. 34; 95/12, 90, 273; 96/111, 96/134, 142, 417; 454/187, 238, 255

See application file for complete search history.

(56) References Cited

U.S. PATENT DOCUMENTS

| | | | | |
|---|---|---|---|---|
| 4,927,438 | A * | 5/1990 | Mears et al. | 55/385.2 |
| 5,326,316 | A * | 7/1994 | Hashimoto et al. | 454/187 |
| 5,858,041 | A * | 1/1999 | Luetkemeyer | 55/385.2 |
| 5,876,280 | A * | 3/1999 | Kitano et al. | 454/187 |
| 6,097,469 | A * | 8/2000 | Yaegashi et al. | 355/30 |
| 6,333,003 | B1 * | 12/2001 | Katano et al. | 422/4 |
| 6,364,762 | B1 * | 4/2002 | Kaveh et al. | 454/187 |
| 6,368,393 | B1 * | 4/2002 | Hironaka | 96/111 |
| 6,817,941 | B1 * | 11/2004 | Gatov | 454/187 |
| 6,960,236 | B1 * | 11/2005 | Tamura et al. | 55/385.2 |
| 7,914,613 | B2 * | 3/2011 | Matsuoka | 96/417 |
| 8,603,217 | B2 * | 12/2013 | Sukhman et al. | 95/8 |
| 2004/0000129 | A1 * | 1/2004 | Ishihara et al. | 55/385.1 |
| 2004/0187452 | A1 * | 9/2004 | Edo | 55/385.2 |
| 2005/0160705 | A1 * | 7/2005 | Bernard et al. | 55/385.1 |
| 2007/0144118 | A1 * | 6/2007 | Alvarez et al. | 55/385.1 |

* cited by examiner

*Primary Examiner* — Duane Smith
*Assistant Examiner* — Minh-Chau Pham
(74) *Attorney, Agent, or Firm* — McClure, Qualey & Rodack, LLP (57) ABSTRACT

Embodiments of mechanisms for controlling a gas flow in an interface module are provided. A method for controlling a gas flow in an enclosure includes providing the enclosure which is capable of containing a substrate. The method also includes providing a gas into the enclosure. The method further includes cleaning the gas. In addition, the method includes actuating the gas to generate the gas flow, and the gas flow passes through the substrate when the substrate is located in the enclosure.

20 Claims, 6 Drawing Sheets

MECHANISMS FOR CONTROLLING GAS FLOW IN ENCLOSURE

BACKGROUND

Integrated circuit (IC) technologies are constantly being improved. Such improvements frequently involve scaling down device geometries to achieve lower fabrication costs, higher device integration density, higher speeds, and better performance. Along with the advantages from geometry size reductions, improvements to the mechanisms to manufacture and produce integrated circuits are being made.

Semiconductor integrated circuits are produced by a plurality of processes in an integrated circuit fabrication facility. These processes, and associated fabrication tools, may include thermal oxidation, diffusion, ion implantation, RTP (rapid thermal processing), CVD (chemical vapor deposition), PVD (physical vapor deposition), etching, and photolithography. During the fabrication stages, products (such as semiconductor substrates) are transported within the fabrication facility and fabrication tools. For example, after a processing step, the semiconductor substrates are removed from a process chamber where processing techniques are performed and transferred to a carrier where the semiconductor substrates are temporarily staged. During the above-mentioned transfer, the semiconductor substrates are exposed to the surrounding environment, which may include undesired airborne molecular contamination, and the semiconductor substrates may become contaminated.

Since a critical requirement for semiconductor manufacturing is the absence of contaminants on the wafer processing surface, a system and method for providing a protective environment is accordingly desired.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Figure 1:
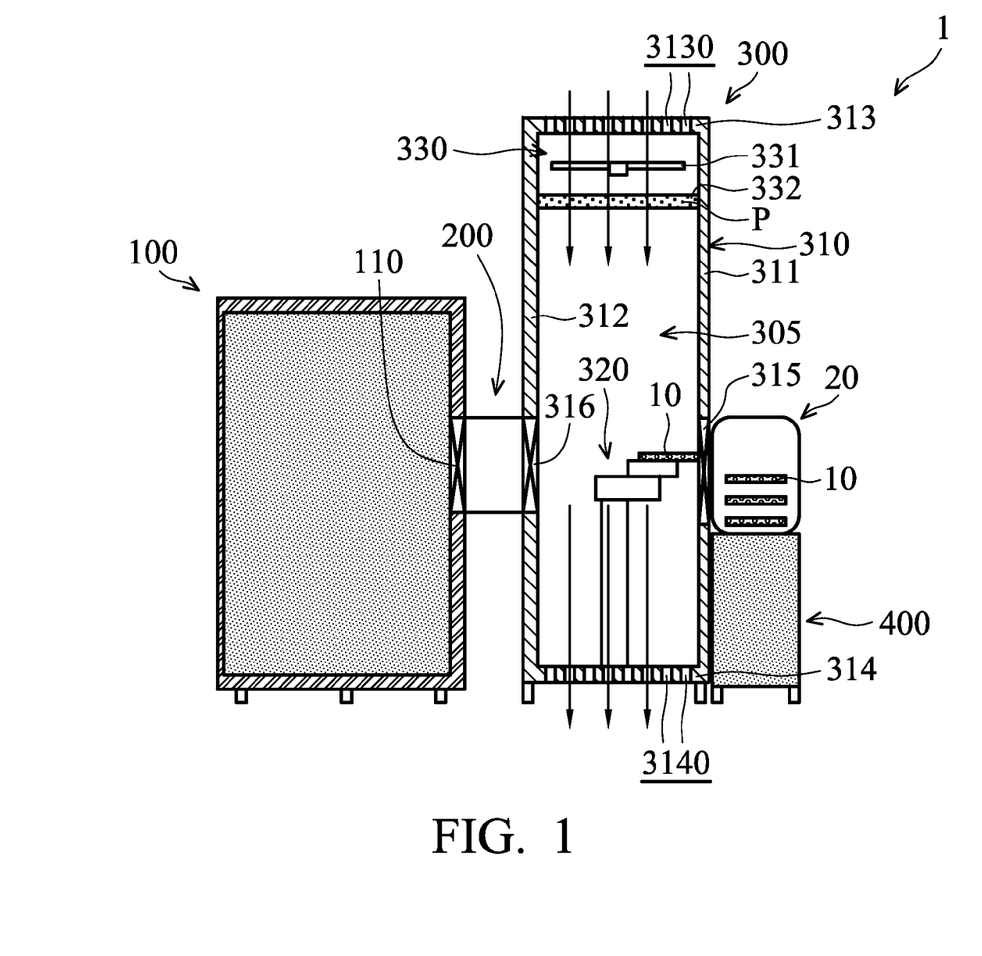
FIG. 1 shows a schematic diagram of a processing apparatus, in accordance with some embodiments.

Referring to FIG. 1, a processing apparatus 1 is illustrated, in accordance with some embodiments. The processing apparatus 1 is configured to process one or more than one substrate 10. The substrate 10 may include a semiconductor, conductor, and/or insulator layers. In some embodiments, the substrate 10 includes layered semiconductors. Examples include the layering of a semiconductor layer on an insulator such as that used to produce a silicon-on-insulator (SOI) substrate, a silicon-on-sapphire substrate, or a silicon-germanium-on-insulator substrate, or the layering of a semiconductor on glass to produce a thin film transistor (TFT). The substrate 10 may go through many processing steps, such as lithography, etching, and/or doping before a completed die is formed.

The processing apparatus 1 includes a process module 100, a load lock module 200, an interface module 300, and a number of load ports 400, in accordance with some embodiments. Additional features can be added to the processing apparatus 1, and some of the features described below can be replaced or eliminated in other embodiments of the processing apparatus 1.

The process module 100 may be configured to perform any manufacturing procedure on the substrate 10. In some embodiments, the process module 100 is configured to perform manufacturing procedures include deposition processes such as physical vapor deposition (PVD), chemical vapor deposition (CVD), plasma-enhanced chemical vapor deposition (PECVD) and/or other deposition processes. In some embodiments, the process module 100 is configured to perform manufacturing procedures that include etching processes such as wet and dry etching and ion beam milling. In some embodiments, the process module 100 is configured to perform manufacturing procedures including lithographic exposure, ion implantation, thermal processes, cleaning processes, testing, any procedure involved in the processing of the substrate 10, and/or any combination of procedures.

The interface module 300 includes a housing 310, one or more transferring means such as robotic arm 320, and a fan filter assembly 330, in accordance with some embodiments. In some embodiments, the interface module 300 is a facility interface. In some embodiments, the interface module 300 includes an equipment front end module (EFEM).

The housing 310 includes a number of walls such as side walls 311 and 312, and two perforated plates 313 and 314, and a number of doors such as doors 315 and 316. The side walls 311 and 312 are connected between the two perforated plates 313 and 314, and an interior environment 305 is formed in the housing 310. The two perforated plates 313 and 314 respectively include a number of perforated holes 3130 and 3140. The perforated holes 3130 and 3140 communicate the ambient environment to the interior environment 305 of the housing 310. The door 315 is formed on the side wall 311, and the door 316 is formed on the side wall 312.

The robotic arm 320 is disposed within the interior environment 305 of the housing 310. The robotic arm 320 is configured for physically transporting the substrate 10. For example, the robotic arm 320 retrieves substrate 10 from a carrier 20 to the housing 310 through the door 315, or the robotic arm 320 transports the substrate 10 to/from the load lock module 200 through the door 316. However, the locations where the robotic arm 320 transports substrate 10 are not limited by the present embodiment. In some other embodiments, the interface module 300 includes multiple robotic arms 32, the robotic arms 320 transport a number of substrates 10 to their respective carriers 20 and load lock modules 200.

The fan filter assembly 330 includes a fan 331 and a filter 332 and is mounted on the top of the housing 310. With the fan filter assembly 330, air flow A is vented in the interior environment 305 through the perforated plate 313 and exhausted through the perforated plate 314 to the ambient environment.

The load lock module 200 is configured for preserving the atmosphere within the process module 100 by separating it from the interface module 300. The load lock module 200 is arranged between a door 110 of the process module 100 and the door 316 of the interface module 300. When substrate 10 is inserted into the load lock module 200, both doors 110 and 316 are sealed. The load lock module 200 is capable of creating an atmosphere compatible with the process module 100 or the interface module 300 depending on where the loaded substrate 10 is scheduled to be next. This may require altering the gas content of the load lock module 200 by such mechanisms as adding gas or creating a vacuum, along with other suitable means for adjusting atmosphere in the load lock module 200. When the correct atmosphere has been reached, the corresponding door may be opened, and the substrate 10 can be accessed.

The load port 400 is adjacent to the door 315 of the interface module 300. In some embodiments, an overhead hoist transport (OHT) (not shown) transports the carrier 20, such as standard mechanical interface (SMIF) or front opening unified pod (FOUP) with substrate 10 from a stocker (not shown) to the load port 400. When the carrier 20 is located on the load port 400, the substrate 10 in the carrier 20 is transferred to the interface module 300 through the door 315.

In some embodiments, as shown in FIG. 1, the air flow A, generated by the fan filter assembly 330, partially reduces contamination by producing a boundary layer above the substrate 10. Therefore, small particles are unable to attach to the substrates 10. Furthermore, particles are swept out of the housing 310 and into the ambient environment.

However, humidity or oxygen content in the air flow A from the ambient environment may cause oxidation of the substrate 10, which will lead to a yield reduction of the substrate 10.

Moreover, when the filter 332 is used to clean air flow A for a while, the filtering efficiency will be reduced due to particle (contaminant) accumulation on the filter 332.

As shown in FIG. 1, after the air flow A is filtered by using the filter 332, contaminating particles P (or contaminants) accumulate on the filter 332. As the filter 332 is continually used for filtering the air flow A, more and more contaminating particles P may adhere to the filter 332 and contaminate the filter 332. Therefore, some of the particulate contaminants may enter the housing 310, and the cleanliness of the housing 310 is degraded.

Figure 2:
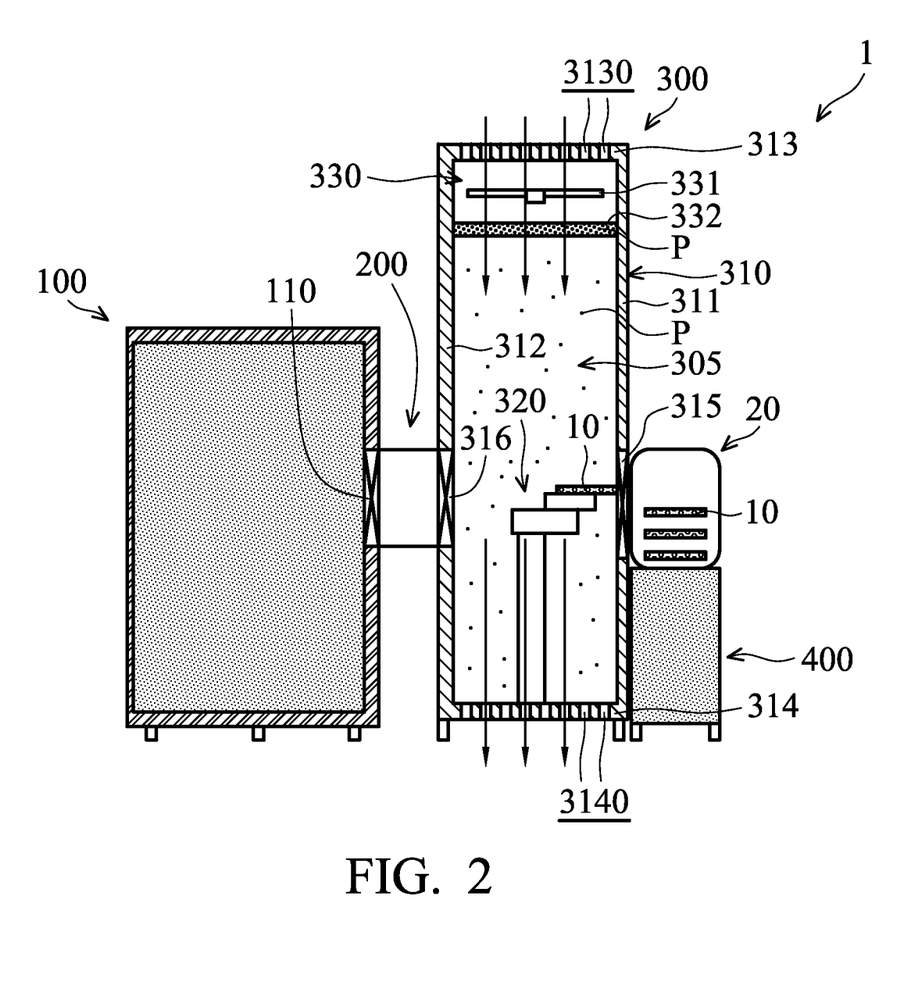
FIG. 2 shows a schematic diagram of the processing apparatus after a filter is used to clean an air flow, in accordance with some embodiments

For example, as shown in FIG. 2, after the filter 332 continues to be used to filter the air flow A, contaminating particles P accumulate on the filter 332. In some embodiments, some of the contaminating particles P fall from the filter 332 and are deposited on the substrate 10. As a result, the substrate 10 are not sufficiently clean.

In order to prevent the problems mentioned above, a new filter may be used to replace the filter 332 which accumulates too many contaminating particles P. However, replacing the filter 332 with the new filter requires the processing apparatus 1 to be shut off. The processing capability of the processing apparatus 1 is lowered. Fabrication cost and time are increased.

Therefore, it is desirable to find an alternative processing apparatus, which is capable of reducing or resolving the problems mentioned above.

Figure 3:
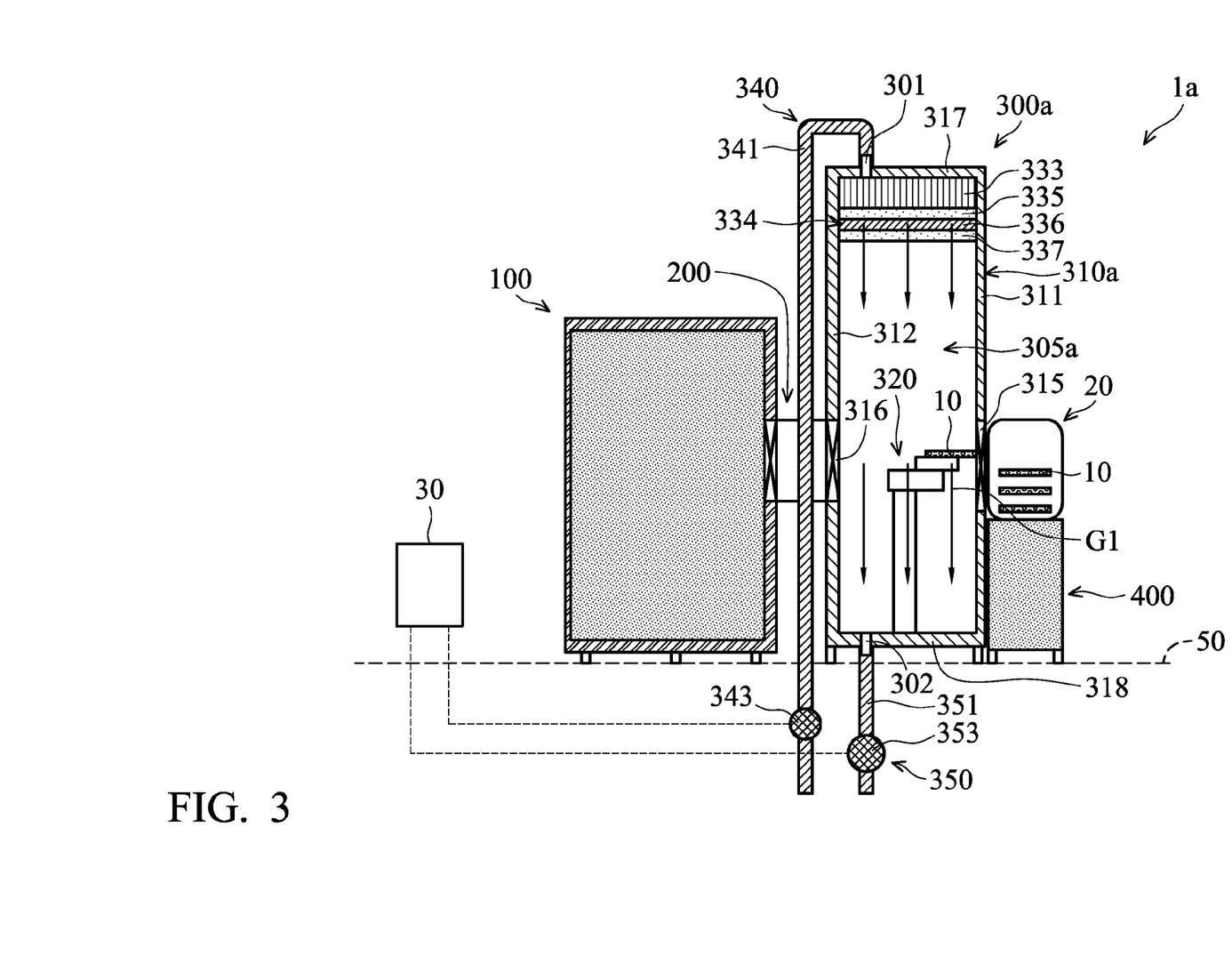
FIG. 3 shows a schematic diagram of a processing apparatus, in accordance with some embodiments.

Referring to FIG. 3, a processing apparatus 1a is provided, in accordance with some embodiments. The processing apparatus 1a includes the process module 100, the load lock module 200, an interface module 300a, and the load ports 400.

The interface module 300a includes a housing 310a, the robotic arm 320, a gas spreader 333, a filter unit 334, an ionizer 337, a gas supply assembly 340, and a gas exhaust assembly 350, in accordance with some embodiments. In some embodiments, the interface module 300a may be a facility interface. In some embodiments, the interface module 300a includes an equipment front end module (EFEM).

The housing 310a includes a number of side panels such as the side walls 311 and 312, an upper wall 317, a lower wall 318, and the doors 315 and 316. The side walls 311 and 312 are connected between the upper wall 317 and the lower wall 318, and an interior environment 305a is formed in the housing 310a. In some embodiments, when the doors 315 and 316 are closed, an enclosure is formed in the interior environment 305a. The interior environment 305a is secluded from the ambient environment. In some embodiments, the upper wall 317 and the lower wall 318 is parallel to a floor 50 where the interface module 300a is located.

In some embodiments, the interface module 300a further includes a gas inlet and a gas outlet. Gas used for a gas purge is injected into the interior environment 305a via the gas inlet, and the gas is discharged from the interior environment 305a via the gas outlet. In some embodiments, the gas inlet and the gas outlet are respectively positioned on the side walls 311 and 312, or the upper wall 317 and lower wall 318. In some embodiments, the gas inlet and the gas outlet are positioned at two ends of the interior environment 305a.

For example, the interface module 300a further includes a gas inlet 301 and a gas outlet 302. The gas inlet 301 is positioned on the upper wall 317, and the gas outlet 302 is positioned on the lower wall 318. Gas is supplied into the interior environment 305a via the gas inlet 301, and the gas is exhausted from the interior environment 305a via the gas outlet 302. In some embodiments, the gas inlet 301 and the gas outlet 302 are openings, nozzles, and/or combinations thereof.

In some embodiments, the gas spreader 333 is positioned at the top of the housing 310a and coupled to the gas inlet 301. The gas spreader 333 is configured for diffusing the gas from the gas inlet 301. For example, the gas spreader 333 is a shower head. An opening is formed on an upper surface of the gas spreader 333, and a number of gas vent holes are formed on a lower surface of the gas spreader 333. The opening of the gas spreader 333 is connected to the gas inlet 301 to intake the gas, and the gas is discharged by the gas vent holes. However, in some embodiments, the gas spreader 333 is omitted. The gas passing through the gas inlet 301 is diffused naturally in the interior environment 305a.

The filter unit 334 includes multiple filters such as a first filter 335 and a second filter 336. The first filter 335 and the second filter 336 are coupled to the gas spreader 333 to filter the gas. In some embodiments, the first filter 335 is a chemical filter, and the gas from the gas inlet 301 enters the first filter 335. The airborne molecular contamination in the gas is removed by the first filter 335. Afterwards, the airborne molecular contamination in the gas is greatly reduced after passing through the second filter 336. The second filter 336 is employed to remove submicron size particles from the gas. In some embodiments, the second filter 336 is a high-efficiency particulate air (HEPA) filter.

In some embodiments, the ionizer 337 is located relative to the substrate 10. For example, the ionizer 337 is located beneath the second filter 336. However, the ionizer 337 may be located in other positions within the interior environment 305a. In some other embodiments, the interface module 300a includes a number of ionizers 337, the ionizers are located in different positions within the interior environment 305a. The ionizer 337 is configured for reducing electrostatic charges that would accumulate on substrate 10.

The gas supply assembly 340 is connected to the interface module 300a and supplies gas into the interior environment 305a via the gas inlet 301. In some embodiments, the gas supply assembly 340 includes a tube 341 and a controller 343. The tube 341 is connected to the gas inlet 301. The gas supply assembly 340 provides the gas to the interior environment 305a through the tube 341 and the gas inlet 301. The gas may include any suitable gas, such as an inert gas including nitrogen ($N_2$), hydrogen ($H_2$), helium (He), or argon (Ar), and/or a combination thereof. The controller 343 is configured for controlling the flow rate of the gas in the tube 341. In some embodiments, the controller 343 communicates with a processor system 30 and is controlled by the processor system 30. In some embodiments, the gas supply assembly 340 further includes a gas cabinet, any other apparatus that is appropriate to provide the gas to the interior environment 305a, and/or a combination thereof.

The gas exhaust assembly 350 is connected to the interface module 300a and removes the gas from the interior environment 305a via the gas outlet 302. In some embodiments, the gas exhaust assembly 350 includes a tube 351 and a controller 353. The tube 351 is connected to the gas outlet 302. The gas in the interior environment 305a is removed by the gas exhaust assembly 350 via the tube 351. The controller 353, such as LFC controller, is configured for controlling the flow rate of the gas in the tube 351. In some embodiments, the controller 353 communicates with the processor system 30 and is controlled by the processor system 30. In some embodiments, the gas exhaust assembly 350 further includes a pump, a vacuum system, an engine, a motor, other apparatus adequate to remove a gas from the interior environment 305a, and/or a combination thereof.

To perform a gas purge on the substrate 10, gas is supplied by the gas supply assembly 340 into the interior environment 305a via the gas inlet 301. In addition, the gas is exhausted by the gas exhaust assembly 350 from the interior environment 305a via the gas outlet 302. Therefore, a gas flow G1 (as shown by arrows in FIG. 3) is formed in the interior environment 305a. In some embodiments, the gas flow G1 has a laminar flow. The gas flow G1 protects the substrate 10 against contamination.

The gas flow G1 in the interior environment 305a may remove residues on the substrate 10 by mechanically driving the residues from the substrate surface, and/or by evaporation and reaction with the residues. As a result, performing the gas purge while the substrate 10 is in the interface module 300a reduces the amount of residues of the substrate 10. In addition, performing the gas purge before the substrate 10 is inserted into the carrier 20 reduces the amount of residues which may potentially contaminate the carrier 20 once the substrate 10 is inserted. Moreover, by performing the gas purge, undesired ambients, particularly moisture and oxygen, are removed from the interior environment 305a of the housing 310a.

Figure 4:
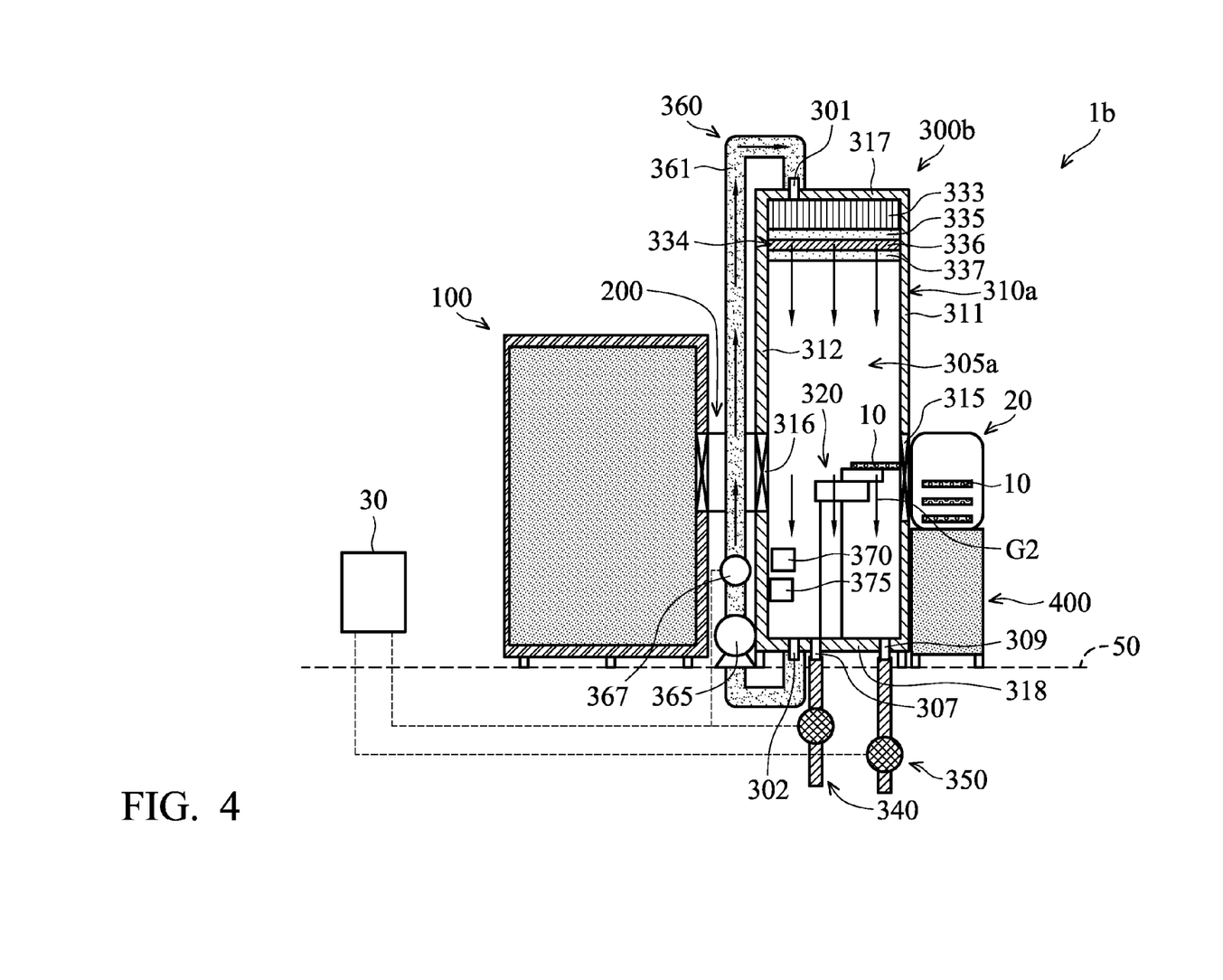
FIG. 4 shows a schematic diagram of a processing apparatus, in accordance with some embodiments.

Referring to FIG. 4, a processing apparatus 1b is provided, in accordance with some embodiments. The processing apparatus 1b includes the process module 100, the load lock module 200, an interface module 300b, and the load ports 400. Differences between the interface module 300b and the interface module 300 include the interface module 300b further includes a gas supplier 307, a gas exhauster 309 and a circulation assembly 360, in accordance with some embodiments.

The gas supplier 307 and the gas exhauster 309 are positioned on the same wall of the housing 310a or different walls of the housing 310a. For example, the gas supplier 307 and the gas exhauster 309 are both positioned on the lower wall 318 of the housing 310a. In some embodiments, the gas supply assembly 340 is connected to the interface module 300b and supplies a gas into the interior environment 305a via the gas supplier 307. The gas exhaust assembly 350 is connected to the interface module 300b and removes the gas from the interior environment 305a via the gas exhauster 309.

The circulation assembly 360 includes a conduit 361 and a driving unit 365, in accordance with some embodiments. The conduit 361 may be connected to multiple ends of the housing 310a. The conduit 361, for example is connected to two ends (e.g. upper end and bottom end) of the housing 310a. The driving unit 365 is connected to the conduit 361. The driving unit 365 may be a blower, a compressor, or a pump other apparatus adequate to remove gas from the interior environment 305a, and/or a combination thereof.

When the driving unit 365 is in operation, the gas in the interior environment 305a is drawn into the conduit 361 and returned to the interior environment 305a. Therefore, a gas circulation G2 (as shown by arrows in FIG. 4) is constructed by the circulation assembly 360. Because the gas, such nitrogen ($N_2$), in the interior environment 305a is contained and recirculated, manufacturing cost is reduced.

In some embodiments, the gas circulation G2 in the interior environment 305a caused by the circulation assembly 360 has a downward flow. Therefore, foreign particles are dislodged by the gas flow to fall down to the bottom of the housing 310a. However, the foreign particles may be drawn into the conduit 361 and return to the interior environment 305a. In order to maintain the cleanliness of the interior environment 305a, the gas circulation G2 is cleaned by a filter arranged on the flowing path of the gas circulation.

For example, the conduit 361 has two ends, one end of the conduit 361 is connected to the gas outlet 302, and the other end of the conduit 361 is connected to the gas inlet 301. The gas spreader 333, the filter unit 334, and the ionizer 337 are positioned at the top of the housing 310a and are coupled to the gas inlet 301. Namely, the gas spreader 333, the filter unit 334, and the ionizer 337 are positioned downstream of the circulation assembly 360. Therefore, the gas discharged from the gas inlet 301 is filtered by the filter unit 334 and flows through the interior environment 305a. Since the gas circulation G2 is continuously filtered by the filter unit 334, the contaminants of the substrate 10 can be sufficiently inhibited.

In some embodiments, the circulation assembly 360 further includes a pressure sensor 367 arranged in the conduit 361. The pressure sensor 367 is configured for monitoring the flow pressure of the gas circulation G2 in the conduit 361. In some embodiments, the pressure sensor 367 communicates with the processing system 30. Therefore, the processing system 30 monitors the flow pressure in the conduit 361 and adjusts the flow pressure by a control of the driving unit 365.

In some embodiments, the interface module 300b further includes a number of control sensors, such as control sensors 370 and 375. The control sensors 370 and 375 may be disposed in or on one of the walls within the interior environment 305a. In some embodiments, the control sensors 370 and 375 monitor the moisture, oxygen, airborne molecular contamination (AMC) level and total organic carbon (TOC) level within the interior environment 305a. In some embodiments, the control sensors 370 and 375 monitor other ambient levels that need to be controlled to maintain a protective environment for the substrate 10. In some embodiments, the control sensors 370 and 375 monitor the pressure levels within the interior environment 305a.

The control sensors 370 and 375 may communicate with the processing system 30. In some embodiments, the control sensors 370 and 375 communicate results to the processing system 30. The processing system 30 controls the gas supply assembly 340, the gas exhaust assembly 350, and the circulation assembly 360 based on the results generated from the control sensors 370 and 375, such that the ambient levels within the interior environment 305a may be returned to acceptable levels.

For example, in some embodiments, based on information and signals received from the control sensors 370 and 375, the processing system 30 determines when the gas supply assembly 340 and the gas exhaust assembly 350 should be switched to enable the gas to be purged/sucked in/from the interior environment 305a. In some embodiments, based on the information and signals received from the control sensors 370 and 375, the processing system 30 controls the driving unit 365 of the circulation assembly 360 to adjust the flow rate of the gas flow in the conduit 361 and the interior environment 305a. By communicating with the control sensors 370 and 375, the processing system 30 can effectively control the undesired ambient levels within the interface module 300b.

Figure 5:
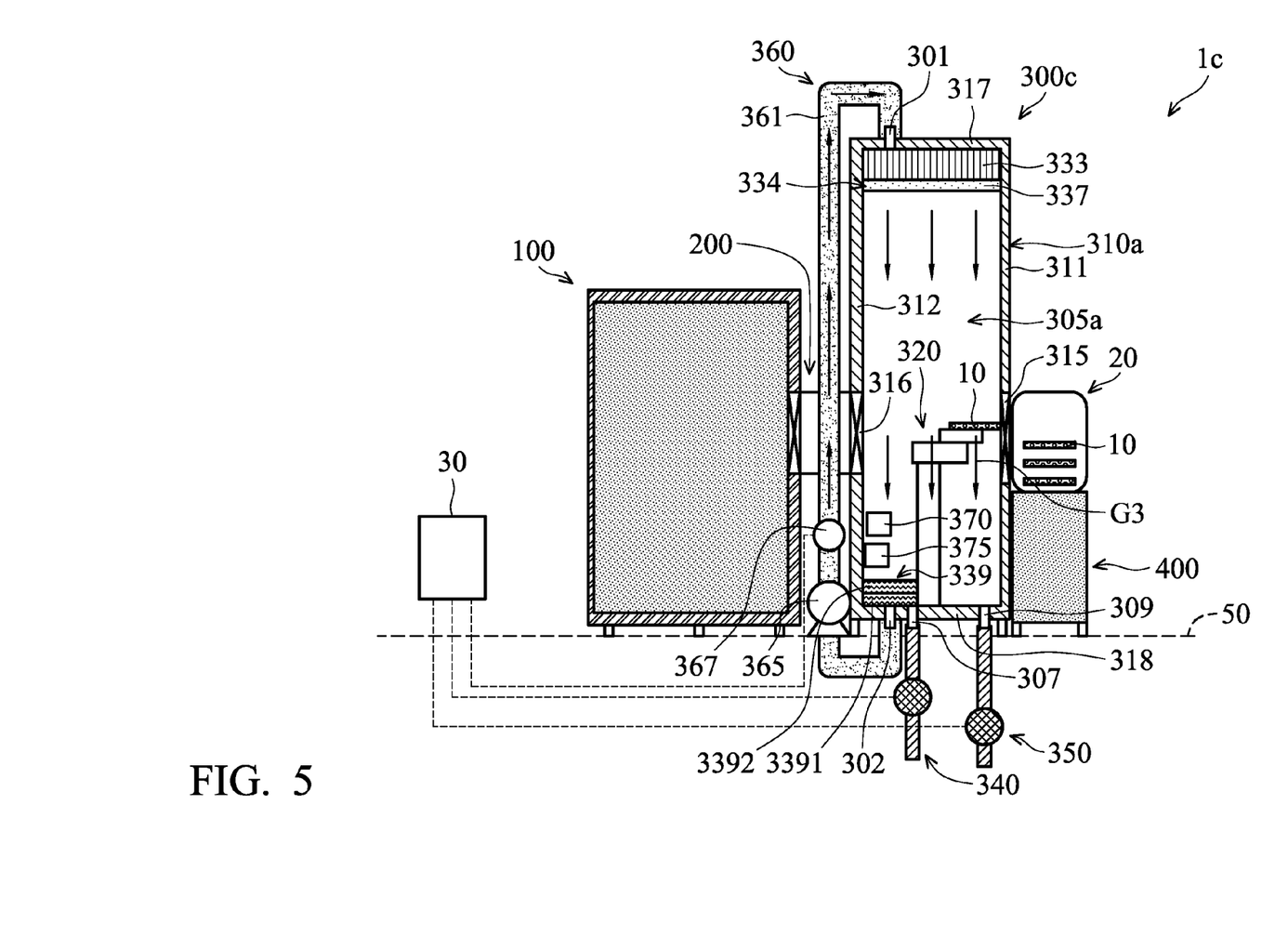
FIG. 5 shows a schematic diagram of a processing apparatus, in accordance with some embodiments.

Referring to FIG. 5, a processing apparatus 1c is provided, in accordance with some embodiments. The processing apparatus 1b includes the process module 100, the load lock module 200, an interface module 300c, and the load ports 400. Differences between the interface module 300c and the interface module 300b shown in FIG. 4 include the filter unit 334 in the embodiments shown in FIG. 4 being omitted, and the interface module 300c includes another filter unit 339.

The filter unit 339 is arranged upstream of the circulation assembly 360. In some embodiments, the filter unit 339 includes multiple filters such as a first filter 3391 and a second filter 3392. In some embodiments, the first filter 3391 is a chemical filter, and the second filter 3392 is a high-efficiency particulate air (HEPA) filter.

When the circulation assembly 360 is in operation, a gas circulation G3 is actuated. The gas in the interior environment 305a of the interface module 300c is drawn into the pipe 361, and the particles in the gas circulation G3 are deposited in the filter unit 339. Therefore, the gas circulation G3 is cleaned and returned to the interior environment 305a via the conduit 361.

In some embodiments, in addition to the gas circulation G3 is filter by the filter unit 339, the gas discharged by the gas supplier 307 is filtered by the filter unit 339. For example, as shown in FIG. 5, the filter unit 339 is arranged corresponding to the gas supplier 307. As a result, the gas, discharged by the gas supplier 307, is filtered by the filter unit 339 before its injection into the interior environment 305a.

Figure 6:
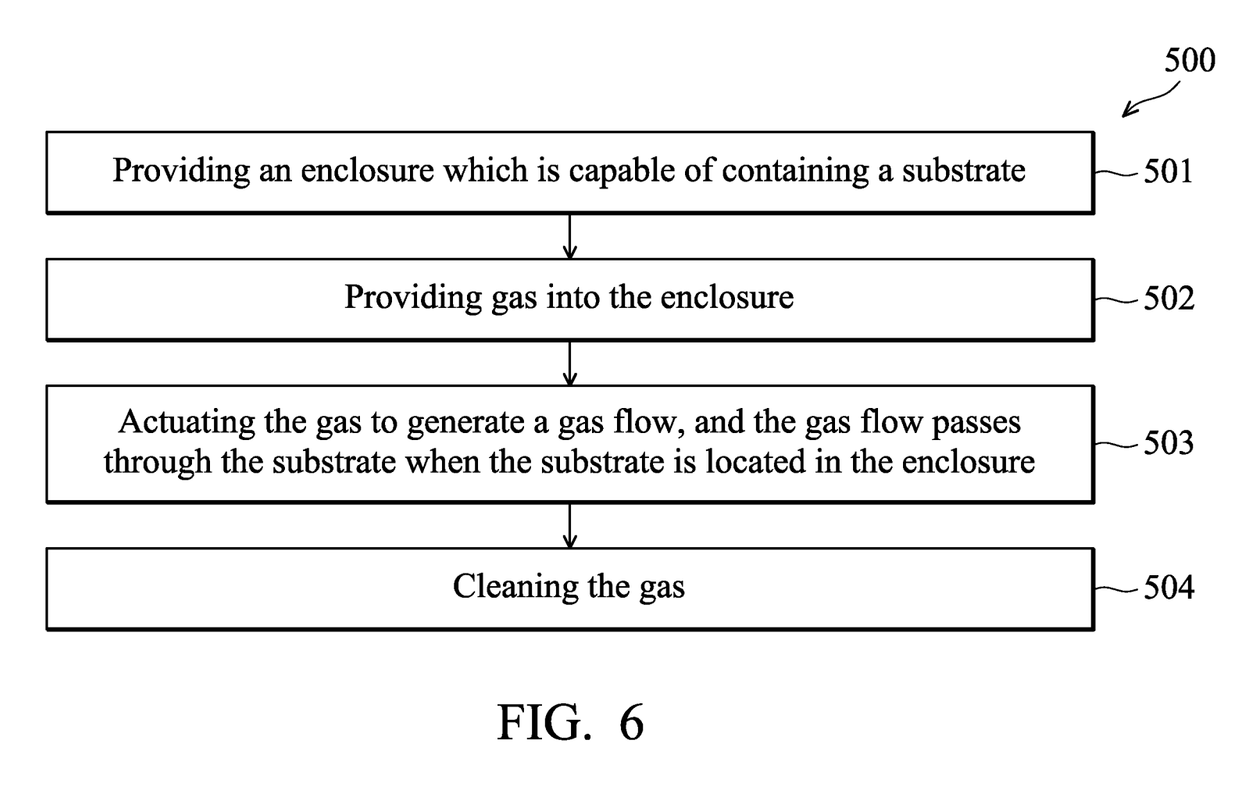
FIG. 6 is a flow chart illustrating a method for controlling a gas flow in an enclosure, in accordance with some embodiments.

FIG. 6 is a flow chart of a method 500 of controlling a gas flow in an enclosure, in accordance with some embodiments.

The method 500 begins with an operation 501 in which an enclosure is provided. In some embodiments, the enclosure is defined by an interior environment of an interface module (such as the interior environment 305a of the interface module 300a, 300b, or 300c), when a passage(s), communicating between the interior environment 305a and an ambient environment, is blocked. For example, when the doors 315 and 316 of the interface module 300a, 300b, or 300c are closed, the enclosure is formed in the interior environment 305a.

The method 500 continues with an operation 502 in which gas is provided into the enclosure. In some embodiments, the gas is supplied by a gas supply assembly (such as the gas supply assembly 340) or by a circulation assembly (such as the circulation assembly 360) via a gas inlet (such as the gas inlet 301). In some embodiments, the gas include any suitable gas, such as nitrogen ($N_2$), hydrogen ($H_2$), helium (He), argon (Ar), any other suitable gas, and/or combinations thereof.

The method 500 continues with an operation 503 in which the gas in the enclosure is actuated to generate a gas flow in the enclosure, and the gas flow passes through the substrate 10 when the substrate 10 is located in the enclosure.

In some embodiments, the gas flow is generated by both of the gas supply assembly 340 and a gas exhaust assembly (such as the gas exhaust assembly 350). The gas provided by the gas supply assembly 340 is drawn by the gas exhaust assembly 350.

In some other embodiments, the gas flow is generated by the circulation assembly 360. Therefore, a gas recirculation is formed in the interface module 300b or 300c, and the gas in the interface module 300b or 300c is contained and recirculated. In some embodiments, residual moisture and oxygen within the enclosure is reduced by suitable means. For example, moisture and oxygen in the enclosure is removed by the gas exhaust assembly 350, and a new gas, such as nitrogen ($N_2$), is provided by the gas supply assembly 340. Therefore, the substrate 10 is protected from being oxidized. In some embodiments, the moisture and oxygen levels are reduced to parts per million (ppm) levels. In some embodiments, the process for reducing residual moisture and oxygen within the enclosure is operated before the gas flow is generated by the circulation assembly 360. In some other embodiments, the process for reducing residual moisture and oxygen within the enclosure is operated while the gas flow is generated by the circulation assembly 360.

In some embodiments, the gas flow in the interface module 300a, 300b, or 300c has a downward flow. Therefore, foreign particles on the substrate 10 are dislodged by the downward flow. In some embodiments, the gas flow has a laminar flow, such that a gas boundary layer (not indicated in figures) is formed on the substrate 10, and the particles are blocked from attaching on the substrate 10.

The method 500 continues with an operation 504 in which the gas flow is cleaned by a filter unit (such as the filter unit 334 or 339). In some embodiments, the filter unit 334 is arranged corresponding to the gas inlet 301, and the gas supplied by the gas supply assembly 340 is cleaned by the filter unit 334. In some embodiments, the filter unit 334 is arranged downstream of the circulation assembly 360, and the gas supplied by the circulation assembly 360 is cleaned by the filter unit 334. In some other embodiments, the filter unit 339 is arranged upstream of the circulation assembly 360, the gas is cleaned by the filter unit 339 prior to its entering into the circulation assembly 360.

In some embodiments, the flow rate of the gas flow is adjusted according to an ambient level in the enclosure. In some embodiments, the flow rate of the gas flow is increased when the AMC level or TOC level is higher than a predetermined limit.

Embodiments of the disclosure have many advantages. For example, the interior environment where substrates are transferred is generally enclosed, such that contamination and/or oxidization risk of the substrates is decreased. In addition, since the interior environment is enclosed, the gas for gas purge is contained and recirculated, so that the manufacturing cost is greatly reduced.

Embodiments of mechanisms for controlling a gas in an interface module are provided. An enclosure is provided in the interface module. A gas flow flows through the enclosure along a particular direction and remove contaminated particles on a substrate. Since the enclosure is secluded from an ambient environment, the risk of contamination and/or oxidization of the substrate during a transfer of the interface module is reduced. Production yield of the substrate is greatly improved.

In accordance with some embodiments, an interface module for transferring a substrate is provided. The interface module includes a housing, a gas inlet, and a gas outlet. The housing includes a number of walls, and an enclosure is defined by the walls. The enclosure is capable of containing the substrate. The gas inlet is positioned on one of the walls of the housing. The gas outlet is positioned on one of the walls of the housing. When the substrate is located in the enclosure, a gas flow between the gas inlet and the gas outlet passes through the substrate.

In accordance with some embodiments, a processing apparatus is provided. The processing apparatus includes a process module configured to process a manufacturing procedure on a substrate. The processing apparatus also includes a load port for supporting a carrier used for transporting the substrate. The processing apparatus further includes an interface module configured to transfer the substrate between the process module and the load port. The interface module includes an enclosure, and a gas circulation is provided in the enclosure. The gas circulation passes through the substrate when the substrate is located in the enclosure.

In accordance with some embodiments, a method for controlling a gas flow in an enclosure includes providing the enclosure which is capable of containing a substrate. The method also includes providing a gas into the enclosure. The method further includes actuating the gas to generate a gas flow, and the gas flow passes through the substrate when the substrate is located in the enclosure. In addition, the method includes cleaning the gas.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An interface module for transferring at least one substrate, comprising:
   a housing comprising an upper wall, a lower wall opposite to the upper wall, and a side wall connected between the upper wall and the lower wall, wherein an interior environment of the housing is sealed as the substrate is transferred by the interface module;
   a load port configured to support a carrier used for transporting the substrate, wherein a first door is arranged corresponding to the load port and positioned on the side wall;
   a load lock module configured to adjusting an atmosphere, wherein a second door is arranged corresponding to the load lock module and positioned on the side wall;
   a gas inlet positioned on the upper wall of the housing; and
   a gas outlet positioned on the lower wall of the housing, wherein a gas flow is driven to flow from the gas inlet to the gas outlet to pass through the substrate in the sealed interior environment, and the moisture and oxygen levels in the sealed interior environment are controlled to parts per million (ppm) levels;
   a gas supplier positioned on the lower wall, wherein the gas supplier facilitates the discharge of gas into the sealed interior environment; and
   a gas exhauster positioned on the lower wall, wherein the gas exhauster facilitates the removal of the gas in the sealed interior environment.

2. The interface module as claimed in claim 1, further comprising a circulation assembly, wherein the circulation assembly comprises a conduit connected to the gas inlet and the gas outlet, and a driving unit configured for driving the gas flow passing through the conduit.

3. The interface module as claimed in claim 2, further comprising a filter unit arranged downstream of the circulation assembly.

4. The interface module as claimed in claim 3, wherein the filter unit comprises a chemical filter and a high-efficiency particulate air filter.

5. The interface module as claimed in claim 2, wherein the circulation assembly further comprises a pressure sensor positioned in the conduit.

6. The interface module as claimed in claim 1, further comprising a control sensor positioned within the sealed interior environment, wherein the control sensor is configured for monitoring the moisture, oxygen, airborne molecular contamination (AMC) level, total organic carbon (TOC) level, or combinations thereof within the sealed interior environment.

7. The interface module as claimed in claim 1, wherein the gas flow comprises nitrogen, hydrogen, helium, argon, or a combination thereof.

8. A processing apparatus comprising:
   a process module configured to process a manufacturing procedure on a substrate;
   a load port configured to support a carrier used for transporting the substrate;
   an interface module configured to transfer the substrate between the process module and the carrier, when the substrate is transferred by the interface module, an interior environment of the interface module is sealed, and a gas circulation is provided in the sealed interior environment, wherein the gas circulation passes through the substrate, and the moisture and oxygen levels in the sealed interior environment are controlled to parts per million (ppm) levels;

a gas supply assembly, located on the interface module, configured to supply gas into the sealed interior environment;

a gas exhaust assembly, located on the interface module, configured to remove the gas in the sealed interior environment; and a filter unit configured for cleaning the gas circulation and the gas of the gas supply assembly.

9. The processing apparatus as claimed in claim 8, wherein the interface module comprises a circulation assembly, and the circulation assembly comprises a conduit connected to two ends of the sealed interior environment, and a driving unit configured for driving the gas circulation.

10. A method for controlling a gas flow in a processing apparatus, comprising:
sending a substrate into an interior environment of an interface module;
sealing the interior environment;
providing gas into the sealed interior environment via a gas inlet located on a housing defining the sealed interior environment;
actuating the gas in the sealed interior environment to generate the gas flow, wherein the gas flow passes through the substrate;
cleaning the gas to control the moisture and oxygen levels in the sealed interior environment to parts per million (ppm) levels; and
removing the gas from the sealed interior environment via a gas outlet located on the housing.

11. The method of claim 10, further comprises increasing the flow rate of the gas flow if an ambient level in the sealed interior environment is higher than a preset value and decreasing the flow rate of the gas flow if the ambient level in the sealed interior environment is less than a preset value.

12. The method of claim 11, wherein the ambient level comprises the airborne molecular contamination (AMC) level and the total organic carbon (TOC) level.

13. The method of claim 10, wherein the gas flow is recirculated by a circulation assembly so as to form a gas recirculation in the sealed interior environment.

14. The method of claim 13, wherein the gas flow is cleaned by a filter unit, and the filter unit is arranged downstream of the circulation assembly.

15. The method of claim 10, wherein the gas flow in the sealed interior environment has a downward flow.

16. The method of claim 10, wherein the gas comprises nitrogen, hydrogen, helium, argon, or a combination thereof.

17. The interface module as claimed in claim 1, the flow rate of the gas flow is adjusted if an ambient level in the sealed interior environment does not meet a preset value.

18. The processing apparatus as claimed in claim 8, wherein the flow rate of the gas circulation is adjusted if an ambient level in the sealed interior environment does not meet a preset value.

19. The method of claim 10, wherein providing gas into the sealed interior environment and the removing of the gas from the sealed interior environment are performed simultaneously.

20. The method of claim 10, wherein providing gas into the sealed interior environment or the removing of the gas from the sealed interior environment is determined to initiate based on the moisture and oxygen levels in the sealed interior environment.

* * * * *